(12) United States Patent
Ferragina et al.

(10) Patent No.: US 8,705,283 B2
(45) Date of Patent: Apr. 22, 2014

(54) ERASE TECHNIQUES AND CIRCUITS THEREFOR FOR NON-VOLATILE MEMORY DEVICES

(76) Inventors: Vincenzo Ferragina, San Denesio ed Uniti (IT); Stefano Surico, Bussero (IT); Giuseppe Moioli, Albino (IT); Simone Bartoli, Mandello del Lario (IT)

( * ) Notice: Subject to any disclaimer, the term of this patent is extended or adjusted under 35 U.S.C. 154(b) by 314 days.

(21) Appl. No.: 13/181,988

(22) Filed: Jul. 13, 2011

(65) Prior Publication Data

US 2013/0016564 A1   Jan. 17, 2013

(51) Int. Cl.
*G11C 11/34*    (2006.01)
*G11C 16/04*    (2006.01)

(52) U.S. Cl.
USPC ............ 365/185.19; 365/185.33; 365/185.18; 365/185.29

(58) Field of Classification Search
USPC .............. 365/185.18, 185.19, 185.29, 185.33
See application file for complete search history.

(56) References Cited

U.S. PATENT DOCUMENTS

| | | | |
|---|---|---|---|
| 6,894,931 B2 | 5/2005 | Yaegashi et al. | |
| 7,079,424 B1 * | 7/2006 | Lee et al. ................. | 365/185.29 |
| 7,522,457 B2 * | 4/2009 | Hemink et al. .......... | 365/185.29 |
| 7,808,829 B2 * | 10/2010 | Lee .......................... | 365/185.19 |
| 2009/0310422 A1 | 12/2009 | Edahiro et al. | |

* cited by examiner

*Primary Examiner* — Hoai V Ho
*Assistant Examiner* — Tri Hoang

(57) ABSTRACT

Disclosed herein is a method that comprises applying a first voltage to a memory cell, applying again the first voltage to the memory cell when the memory cell have not been shifted to an erased condition, and applying a second voltage to the memory cell when the memory cell have not still been shifted to an erased condition, the second voltage being higher than the first voltage.

18 Claims, 10 Drawing Sheets

ERASE TECHNIQUES AND CIRCUITS THEREFOR FOR NON-VOLATILE MEMORY DEVICES

BACKGROUND OF THE INVENTION

1. Field of the Invention

This disclosure generally relates to techniques and circuits for non-volatile memory devices, particularly flash memory devices. In an exemplary embodiment, it relates to techniques and circuits for an erase operation in a flash memory device.

2. Description of Related Art

One of the most important parameters of a flash memory device is the capability to tolerate a number N of program-erase cycles before failing. Every time a memory cell is programmed and after erased it suffers a big stress due to the high voltages used to perform the program and erase operation. After a number N of cycles the memory cell cannot be programmed or erased any more resulting in a read fail. For example, the number N is usually in the order of hundreds of thousands of cycles.

The number of program-erase cycles that a memory cell can tolerate before failing depends on the process used to manufacture the memory. However, memory design can improve the endurance of the cells by means of controlling in a proper way the high voltages applied during program and erase. This invention relates to the erase phase.

NAND memory array is, for example, organized in strings as shown in FIG. 7. Each string includes a number n of cells in series and two selectors, one for source side and one for drain side. A multiplicity of strings are connected to the same bit line on y direction and the structure is then repeated on x axis to reach the full page size, which is the portion of the array addressed at a time for reading and program operations. As a result, each memory array is divided in a number M blocks, including one string for each bit line. In a few cases, even and odd bit lines can be addressed separately and belong to different pages, but a page is constituted of cells connected by same word line. Blocks are addressed selectively and represent the minimum area of memory cells to be biased for each erase operation.

In NAND memory devices the whole block is erased at the same time by raising the matrix well and keeping the word lines of selected block grounded. Source line and bit lines are left floating and charged to the well voltage minus the threshold of source and drain junctions of the strings. Selector gates and unselected strings word lines are left floating, and they rise by coupling effect with the array well. This allows a high electrical field to be applied on the gate oxide of selected memory cells and electrons are removed due to Fowler-Nordheim effect from the floating gate or trapping layer in the case of standard or charge trap NAND memory cells, respectively. Unselected word lines and selectors' rising prevent the formation of this high electrical field on their oxide, thus avoiding the erasure of unselected blocks and stress on the selectors.

Controlling in a proper way the voltage is applied to the array well is crucial for the reliability of memory cells since a too high voltage can destroy the memory cell oxide while a too low voltage may not be sufficient to erase the cell. Another important parameter to be kept under control during the erase pulse is the time the voltage is applied to the array well. Time parameter is linked to the voltage value (usually, bigger the voltage less the time) and also to the memory specifications since the erase time is critical in every applications where memory is used.

The voltages and the timings applied to the array during the program and erase operations are, for example, controlled by microcontroller 5 as shown in FIG. 10. The microcontroller, executing an algorithm stored in ROM 7, controls internal voltage regulators 27 and the switches in order to apply the correct voltages to the memory array in the correct timing sequence. Since the behavior of the memory cells depends on the process used to manufacture them, usually the optimal value of the voltages and timings are unknown during the design phase. The designers usually choose a default value for voltages and timings leaving the capability to change these values during the testing phase of the device. Once the correct values are known, these values are stored into a portion of memory array 16a. During the power-on of the memory device the information stored in the configuration portion of the memory array is read and then is available to the microcontroller in order to apply the correct voltages during the operations.

The simplest erase algorithm, commonly used in NAND flash memories, apply a single pulse to the array well with a constant voltage (Verase) for a fixed time (Terase). In FIG. 8A is shown an example of single erase pulse with Verase=16V and Terase=12 ms. Both Verase and Terase are configurable during the testing of the device.

The disadvantage of this solution is the fact that it does not take into account the aging of the memory cells. In fact, the memory cells loose their characteristics due to repeated program-erase cycles and as a result become harder to program and erase. This means that Verase and Terase values that are good when memory cells have done only few cycles are not good when cells have done thousands of cycles. Usually, the values for Verase and Terase are chosen in order to allow erase when memory cells are aged, but those values are too high for young cells. Such unnecessary stress on young cells can cause faster aging of the cells.

A more complex algorithm applies more than one pulse. Each pulse is at fixed voltage and it is shorter than the single pulse of the previous algorithm. Each pulse is followed by a read verify phase. If the read shows that the block has been correctly erased, the algorithm ends. Otherwise, a new pulse with a greater voltage is applied. This algorithm is more flexible relative to the previous one, and it adapts better to the memory cells aging. In fact, it applies lower voltage for shorter time (less pulses) when cells are fast to erase, and applies higher voltage for longer time (more pulses) when cells are harder to erase.

In this type of algorithm, the configurable parameters are: the voltage of the first erase pulse (Vstart), the voltage step between each pulse (Vstep), the duration time of each pulse (Tpulse), the maximum number of pulses (Nmax) and the maximum voltage (Vstop). Vstop is an important parameter because when the pulse voltage reaches the Vstop value and the max number of pulses is not reached yet, the last pulses are given at Vstop value. In FIG. 8B is shown an example of this algorithm with Vstart=14V, Vstep=0.5V, Tpulse=0.6 ms, Nmax=12 and Vstop=18V in the case that all N erase pulses are given.

Erase operations are shown in U.S. Pat. No. 6,894,931 and U.S. Pub. No. 2009/0310422. Each of these implementations show a sequence of operations that is executed until an erase verify ends successfully. When it is judged that data is not sufficiently erased, the erase voltage is increased stepwise and the same erase operation and the same erase verify operation are repeated.

However, when data write or data erase is repeatedly conducted on a memory cell many times, charges trapped in a charge accumulation film of the memory cell gradually become hard to flow out. In that case, even if an erase operation is repeated the same number of times as before, a threshold voltage of the memory cell does not easily drop. Accordingly, if a number of repetitions of the write-erase operation for a certain memory cell increases, it is necessary to increase the number of repetitions of the erase operation and the erase verify. The increase of the number of repetitions of the erase operations prolongs the erase time, lowering the performance of the flash memory.

In technology where the dynamic of voltages (the range of permitted voltages between Vmax and Vmin) is narrow, the inventors have determined that there are two possible consequences under the above approach.

FIG. 9A refers to the case where one does not want to change the width of each single pulse (width representing the duration of the pulse), the consequence of which is that the maximum permitted voltage is reached after a short time (after only few pulses). The remaining time to erase will be used at maximum voltage.

However, applying high voltages cause unnecessary stress especially on young cells and make degradation of those cells faster. Furthermore, reaching too high voltages for erase operation can introduce undesired effects like "back injection or "push out" that causes a "moving" of distribution "towards" programming side that is the opposite than desired.

FIG. 9B shows a second possible approach—to avoid a fast reaching of Vmax, the time of each single pulse is increased. This means that from beginning young blocks will be stressed for a time much longer than required. This unnecessary stress will increase the erase time for the young blocks and cause a degradation of performances.

Therefore, the choice of algorithm sequence is very difficult because the optimum compromise among voltages to use, single pulse duration, and performances changes when technology shrinks, dynamic of voltages is narrow and new parasitic effects become important.

As described above, high voltages make the erase operation faster but cause a faster aging of cells. Reaching too high voltages can introduce undesired effects, for example, "back injection" and "push-out." Consequently, there is a maximum voltage not to overcome while at the same time it is important to lower degradation (erase stress) by using the higher permitted voltage as late as possible.

"Back injection" is a phenomenon that can occur during an erase operation when the erase voltage is too high. It can cause some electrons to enter the trap element through the top oxide rather than leave the trap element through the bottom oxide. If these electrons entering through the top oxide overcome those leaving through the bottom oxide, the effect is that a number of electrons in the trap element increases, resulting in a higher threshold.

"Push-out" is another phenomenon that can occur during an erase operation when an erase voltage is too high. The electrical lateral field produced between the wordlines of drain and source selectors (while erasing a block) and the external block wordlines (e.g., WL0 and WL31 in a 32 string NAND architecture) can cause a charge trapping between the selectors and the neighborhood wordlines, the effect of which is to enhance the threshold of cells on these external wordlines.

Another problem with recent technologies is that applying on "young" blocks erase voltages for a time longer than required causes not only a decreasing of performances on those young blocks but also a faster aging of those blocks due to useless erase stress.

SUMMARY OF THE INVENTION

In an embodiment, a method can comprise applying a first voltage to a memory cell, applying again the first voltage to the memory cell when the memory cell have not been shifted to an erased condition, and applying a second voltage to the memory cell when the memory cell have not still been shifted to an erased condition, the second voltage being higher than the first voltage.

In another embodiment, a memory erase method can include performing multiple memory erase operations at a first voltage and performing at least one subsequent memory erase operation at a second voltage, the second voltage being greater than the first voltage.

In still another embodiment, a device can comprise a memory array including a plurality of memory cells, an erase pulse circuit configured to supply the memory array with a first erase pulse in response to a first control information and with a second erase pulse in response to a second control information, the second erase pulse being higher in voltage level than the first erase pulse, and a control circuit configured to produce the first control information in order to bring each of the memory cells of the memory array into an erased state, the control circuit being further configured to produce the first control information at least one more time when at least one of the memory cells has not been brought into the erased state, the control circuit being further configured to produce the second control information when at least one of the memory cells has not still been brought into the erased state irrespective of having been supplied with the first erase pulse twice or more times.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

An exemplary method relates to a configurable algorithm for erasing CT-NAND memories. The description below will be made only on the parts related to the present invention. The description of the other parts of the NAND memories according to the invention will be omitted since they can be configured using known techniques.

Figure 1:
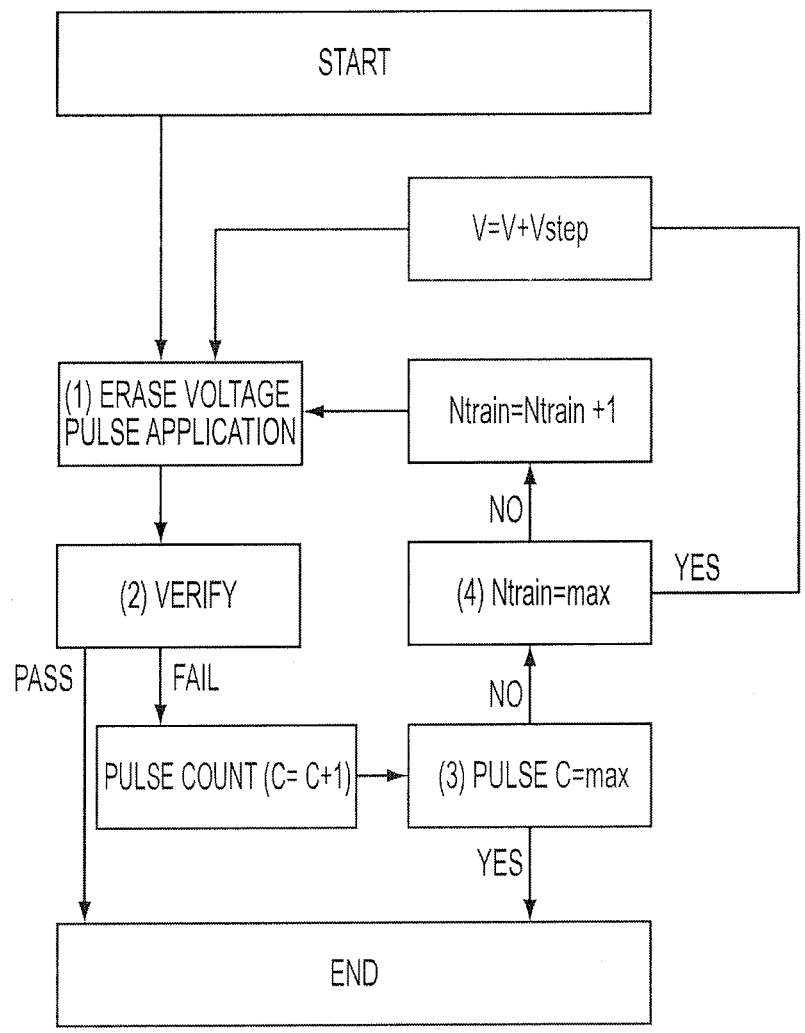
FIG. 1 is a flow chart showing an erase algorithm for NAND memories according to an embodiment.

FIG. 1 depicts a flow chart showing an exemplary erase algorithm for a NAND memory. Erase voltage pulse application (1) represents applying a voltage (a single pulse) to an array well of the memory cells to be erased. Verify (2) represents verifying the erase operation to determine whether the selected memory cells have been successfully erased or not, in other words whether the memory cells have been shifted to an erase condition or not. If the selected memory cells were erased (i.e., data stored in the cells has been erased), the erase operation is considered to have passed ("pass" in FIG. 1) and the algorithm ends. If the selected memory cells were not erased, the erase operation is considered to have failed ("fail" in FIG. 1) and the algorithm continues.

A total pulse count C is maintained and is incremented each time the erase operation fails (at any applied voltage). The pulse count C is compared to a maximum allowable number of pulses (3). If the total pulse count C reaches the maximum allowable number of pulses ("Yes" in FIG. 1), the algorithm ends. If the total pulse count C has not reached the maximum allowable number of pulses ("No" in FIG. 1), the algorithm continues.

To enhance flexibility and to make it possible to choose the optimal time duration for each pulse of the erase operation, a counting variable is introduced in the algorithm. The variable Ntrain represents the number of applied pulses at the same voltage (each pulse being separated by the erase and verify operations). Ntrain is compared to a maximum number of allowable pulses for the currently applied voltage (4).

If Ntrain has not reached the maximum number of allowable pulses at the current voltage ("No" in FIG. 1), Ntrain is incremented by one and the voltage to be used in the next pulse application is not increased. The algorithm then continues again with another erase voltage pulse application (1) at the same voltage.

If Ntrain has reached the maximum number of allowable pulses at the current voltage ("Yes" in FIG. 1), the voltage to be applied V is increased in an amount equal to Vstep. The algorithm then continues again with another erase voltage pulse application (1) at the higher voltage.

Figure 2:
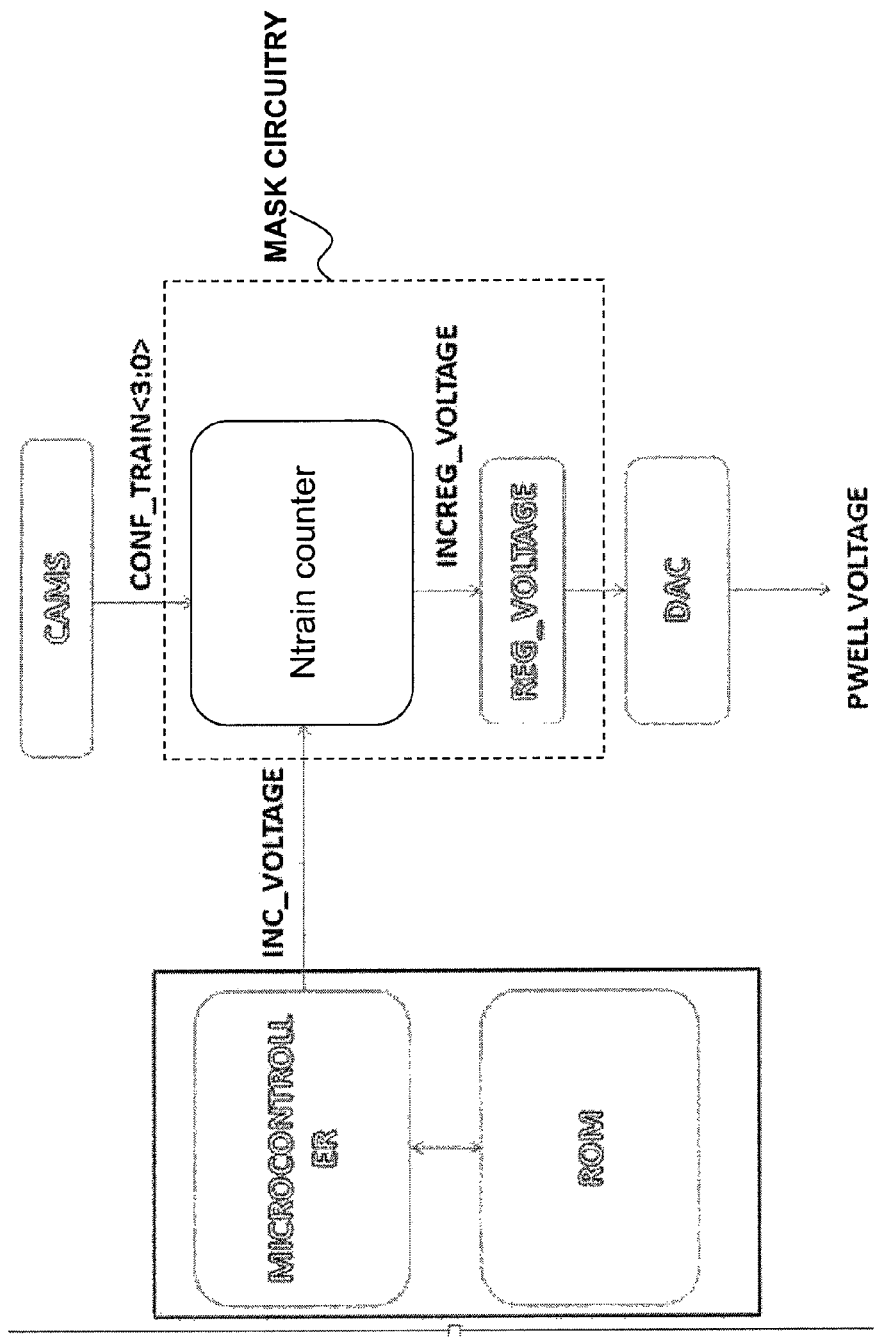
FIG. 2 is a block diagram showing an exemplary hardware implementation that can be used to implement the erase algorithm of FIG. 1.

FIG. 2 is a block diagram showing an exemplary hardware implementation that can be used to implement FIG. 1's erase algorithm. After each erase operation that fails, microcontroller can set a signal INC_VOLTAGE to increment the applied voltage. MASK CIRCUITRY, however, can mask the INC_VOLTAGE so that the voltage to be applied is incremented only in accordance with the conditions described in FIG. 1. Thus, when Ntrain reaches the maximum number ("Ntrain=max" in FIG. 1) of allowable pulses at the current applied voltage, mask circuitry can set a signal INCREG_VOLTAGE to cause the register REG_VOLTAGE to increment. The incremented value in REG_VOLTAGE can then be converted by the digital to analog converter DAC and the incremented voltage can be applied to the memory array as PWELL VOLTAGE. Of course, if the maximum number of allowable pulses at the current applied voltage has not yet been reached, then MASK CIRCUITRY will not set INCREG_VOLTAGE and the value in REG_VOLTAGE will not be incremented. Accordingly, the unincremented value will be converted by DAC and applied to the memory array as PWELL VOLTAGE.

The number of times that MASK CIRCUITRY will mask INC_VOLTAGE (i.e., the maximum number of allowable pulses at the current applied voltage) can be configured using the content addressable memory CAMS (hereafter, CAMS). The CAMS may be structured to be fuses, non-volatile memory, or other storage component storing data. The CAMS can be configured to set a signal CONF_TRAIN, which MASK CIRCUITRY can use as the maximum number of allowable pulses at the current applied voltage.

Accordingly, although the algorithm executed by the microcontroller provides an INC_VOLTAGE signal after each failed pulse, configurable hardware circuitry determines whether or not to increment the voltage to be applied to the well. For example, if CAMS are configured so that Ntrain has a value of 3, microcontroller will set after each new pulse an INC_Voltage signal but this signal will be masked by the circuitry three times. This permits to configure the overall erase algorithm without changing algorithm code for the microcontroller that is stored in memory (ROM).

Figure 3:
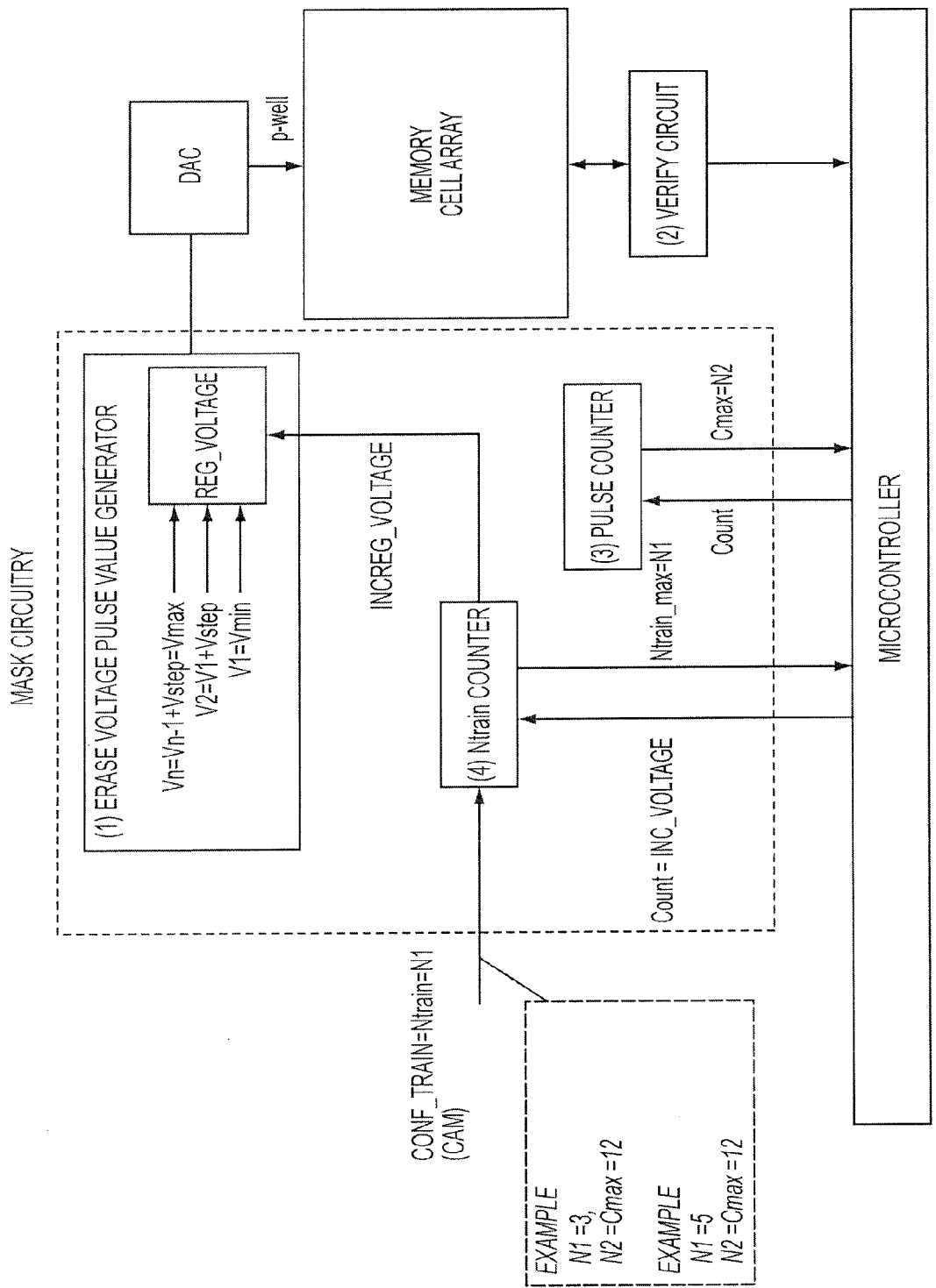
FIG. 3 is a block diagram showing in detail the block diagram of FIG. 2.

FIG. 3 is the detailed block diagram of FIG. 2 to show an exemplary non-volatile memory device that can be used to implement FIG. 1's exemplary erase algorithm.

A non-volatile, for example NAND, memory device comprises a memory cell array, a verify circuit, the DAC, the microcontroller and the MASK CIRCUITRY. The memory cell array includes a plurality of cells for example a NAND cells. The MASK CIRCUITY comprises an erase voltage pulse value generator (hereafter, generator), a Ntrain counter and a pulse counter.

The microcontroller starts the erase operation (erase algorithm) of FIG. 1 in response to receiving an erase command supplied from external of a device.

The DAC or a circuit comprised therein supplies an erase voltage pulse to p-well associated with memory cells in a memory cell array. The REG_VOLTAGE stores values of the erase voltage pulse and each of the values are converted from the digital to analog by the DAC, then an erase voltage pulse with the converted value is supplied to the pwell.

The verify circuit verifies whether the cells have been erased ("Pass" in FIG. 1) or not ("fail" in FIG. 1). A result of the verifying is communicated to the microcontroller.

The microcontroller terminates the erase algorithm when it is verified that the cells have been erased ("Pass" in FIG. 1). On the hard hand, the microcontroller, when it is verified that the cells have not been erased ("fail" in FIG. 1), increments the PULSE COUNTER.

A pulse counter counts a number ("C=C+1" in FIG. 1) of total erase voltage pulses that are applied to the p-well.

Then the microcontroller ends the erase algorithm when the counted number has reached Cmax, where Cmax is a positive number that is larger than two. On the other hand, the microcontroller, when not reached, asserts an INC_VOLTAGE signal to the NTrain counter.

The Ntrain counter increments its counting variable N in response to the INC_VOLTAGE signal. When N is smaller than Ntrain_max (N<Ntrain_max), where Ntrain_max is a positive number that is larger than one, no action to assert the signal INCREG_VOLTAGE is executed, while, when N is equal to Ntrain_max (N=Ntrain_max), N is reset to zero and the Ntrain counter asserts the signal INCREG_VOLTAGE to the generator (the REG_VOLTAGE).

The generator (the REG_VOLTAGE), when the signal INCREG_VOLTAGE is not asserted, does not take any action and holds configuration of bit to DAC; next erase voltage pulse will be provided with p-well of the cells at the same voltage level of previous one. The same level of voltage pulse is supplied to p-well of the semiconductor device. The same level may include substantially same level, the same voltage value, substantially same voltage value and it may include a level that is established by an erase voltage-generating circuit with the same setting, a level that is unwillingly varied according to temperature condition or noise, or the like. On the other hand, the generator (the REG_VOLTAGE), when the signal INCREG_VOLTAGE is asserted, changes value of the REG_VOLTAGE, and thus configuration of bit to DAC will be changed from Vi to Vi+Vstep, where i is a positive number. In FIG. 3, V1 is an initial level of a voltage pulse that is applied to the p-well, and V2 is the stepped up level that is larger than the initial level of V1. The stepped-up level of voltage pulse is applied to the pwell of the memory array. Additionally, if a level of erase voltage pulse reaches to be equal to Vmax, no action to increase is taken.

A number to be Ntrain, for example "N1=3" or "N1=5", is stored in the CAMS. The number is set to the Ntrain counter in advance. A number to be Cmax, for example "N2=12", is stored in the CAMS. The number is set to the Pulse counter in advance. If the CAMS are structured to be fuses, the number of Ntrain or Cmax is determined and is fixed by cutting the fuses.

The micro controller ends the erase algorism when the data of the cells have been successfully erased, or when Cmax have been reached without that successful erasure of the data of the cells. It may be configured to end the erase algorithm with predetermined total time duration.

As explained above, the non-volatile device of FIG. 3 implements the flow chart of FIG. 1

Next, to better explain the advantage of using the new variable, Ntrain, in the case of narrow dynamic of voltages, a simple equation is introduced. Terms are defined as following:

"Vmin" is the voltage to use for the first erase pulse (it is supposed that on silicon, an erase pulse voltage lower than Vmin has no erase effect on a cell block).

"Vmax" is the maximum erase voltage one can use to erase blocks without causing undesired effects such as back injection or push out.

"Vstep" is the minimum erase voltage step that our analog circuitry (DAC) is able to control.

"Tpulse" is the time duration of each pulse of erase algorithm.

"Tmax" is the maximum erase time one has to guarantee not to exceed specification.

"Tverify" is the fixed time duration of erase verify phase.

Figure 8A:
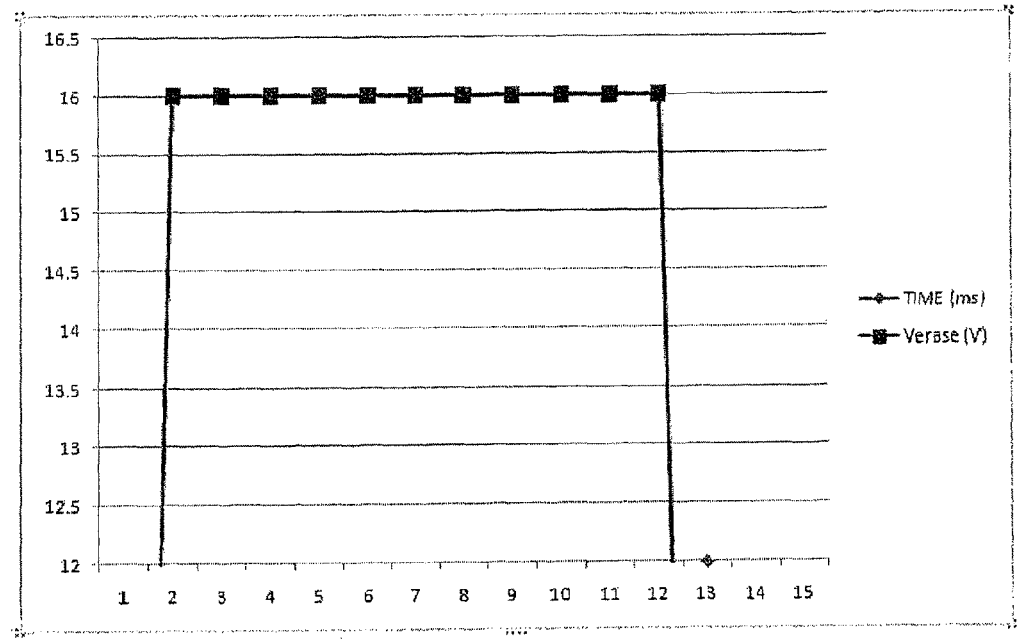
FIGS. 8A and 8B are voltage-time graphs showing exemplary erase operations.
Figure 8B:
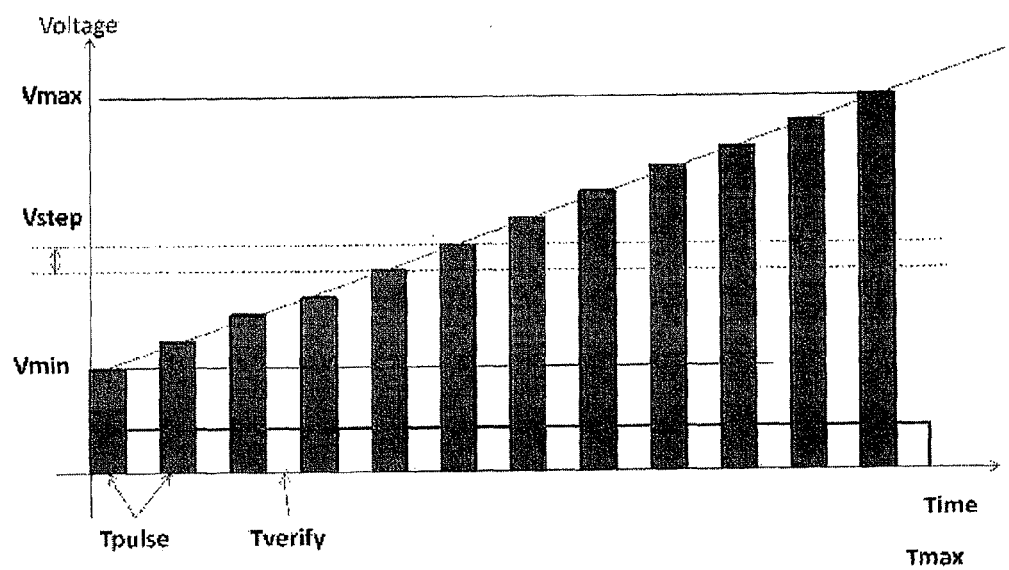

In the case of using algorithm sequence described in FIG. 8B (applying voltage that increases stepwise upon each erase fail), it is possible to write the equation as follows:

$$Tmax=((Vmax-Vmin)/Vstep) \times (Tpulse+Tverify)$$

Typically, Tpulse>>Tverify so one can assume Tpulse+Tverify≅Tpulse. Further, Tmax is typically fixed by specification, Vmax and Vmin are fixed by technology, and Vstep is fixed by design. Then, one can express Tpulse by following equation:

$$Tpulse=(Tmax \times Vstep)/(Vmax-Vmin) \qquad (Eq. 1)$$

Figure 9A:
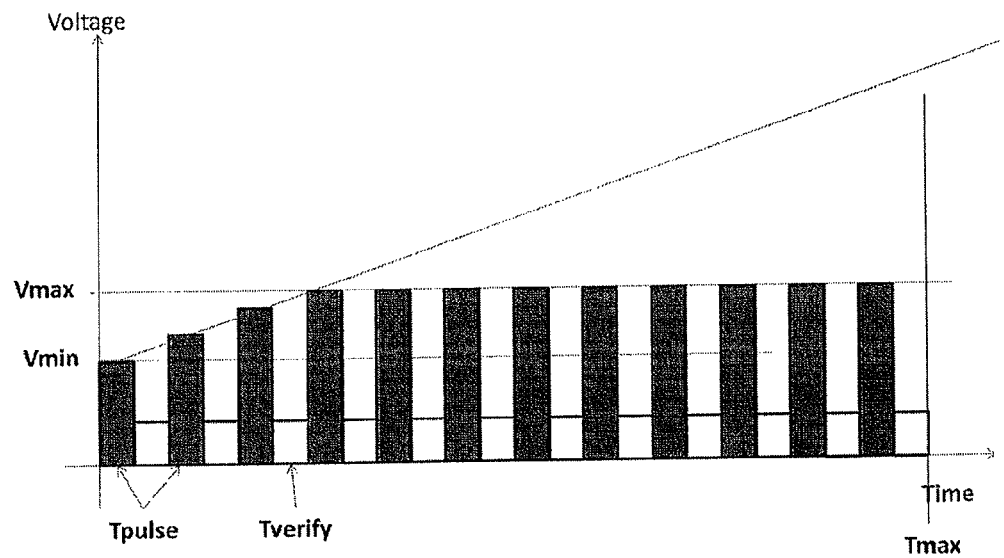
FIGS. 9A and 9B are voltage-time graphs showing exemplary erase operations where the dynamic of voltages is narrow.
Figure 9B:
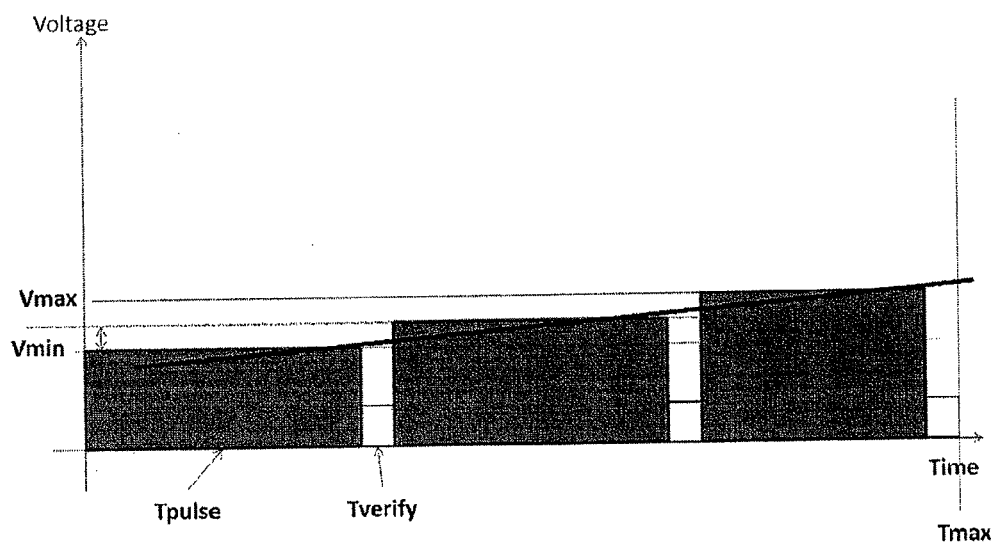
Figure 10:
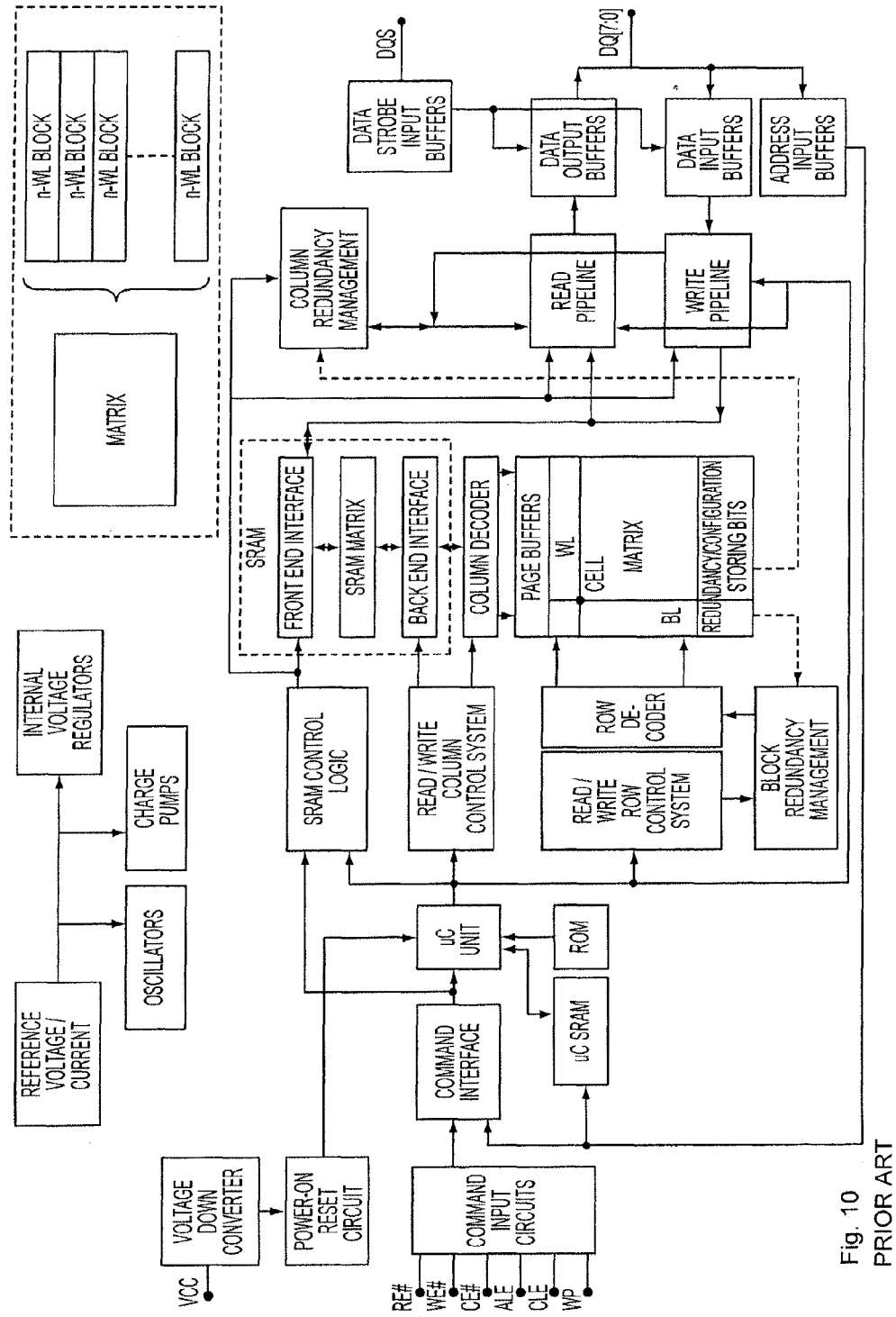
FIG. 10 is a typical block diagram illustrative of an exemplary NAND memory device.

According to Eq. 1 if technology imposes a Vmax close to Vmin (resulting in narrow dynamic of voltages), the consequence is that Tpulse has to be very large as shown in the example of FIG. 9B. Of course it is possible to use a shorter Tpulse but this should cause a too fast reaching of maximum voltage (T1<<Tmax) as shown in the example of FIG. 9A, and this will cause a faster aging of the cells.

However, by introducing the variable Ntrain, it becomes possible to avoid such situations because next pulse after an erase fail is not obliged to be provided with a higher voltage. By introducing a circuitry between controller and DAC and a group of fuses it is possible to define the best value of Ntrain to ensure desired erase sequences shape and the optimum desired Tpulse. The new equation with Ntrain is as follows:

$$Tpulse=(Tmax \times Vstep)/\{(Vmax-Vmin) \times Ntrain\} \qquad (Eq. 2)$$

Also in this case, it has been supposed Tpulse>>Tverify.

This new equation permits to lower pulse duration (without involving Vmax, Vmin, Vstep or Tmax) by setting desired Ntrain. It is important that Ntrain is not a parameter fixed by technology or critical for design. In a design that implements the present invention, it is possible on silicon characterization to lower the shape of erase sequence (slope of the erase sequence) by increasing Ntrain by means of fuses.

Figure 4:
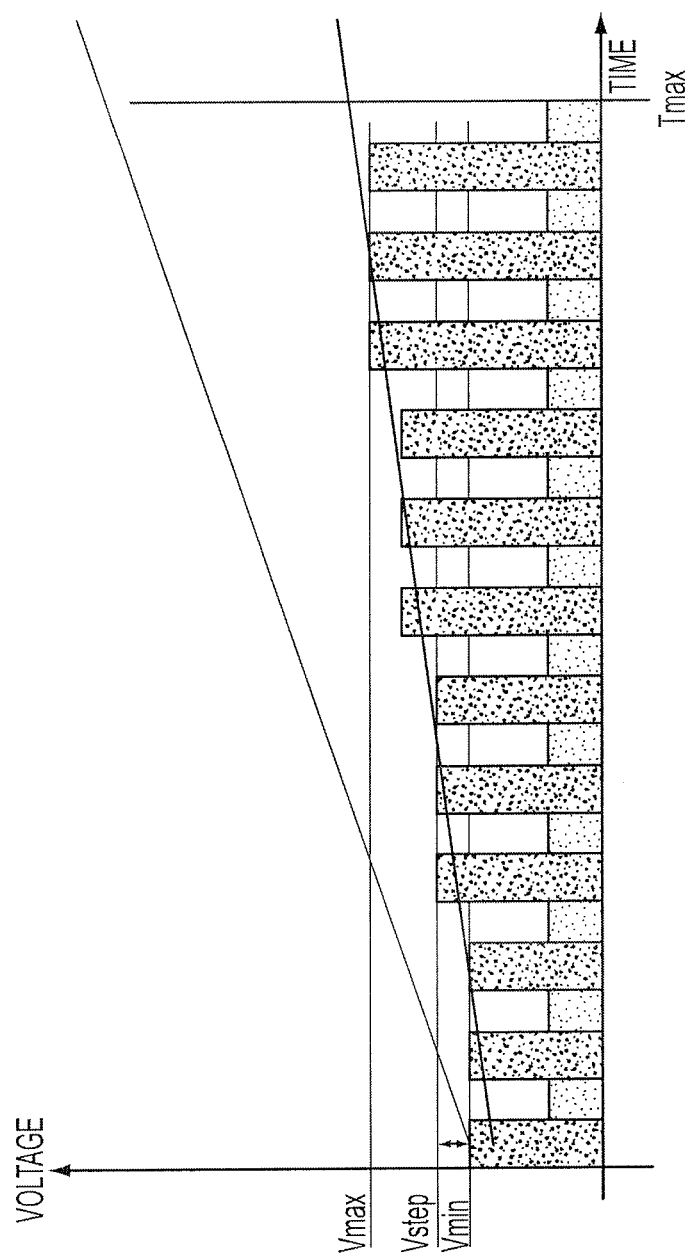
FIG. 4 is a voltage-time graph showing exemplary erase operations for NAND memories when Ntrain is set to be 3.

FIG. 4 is a graphic representation of Eq. 2 when Ntrain is set to be 3. In FIG. 4 is shown an example of the voltage-time graph with Vmin=15V, Vstep=0.5V, Vmax=16.5V, Verify voltage=2V, Tverify=100 μsec, Ntrain=3, Cmax=12, and Tpulse=1 msec. In this case, the shape of erase sequence has been lowered leaving a Tpulse short and reaching maximum voltage Vmax close to Tmax. In previous art approach, after the failed erase verify the second pulse is applied with a higher voltage. In the present invention, the second pulse is applied at the same condition of the first pulse. If the memory can be successfully erased with another short erase time at same voltage condition, it could lower the amount of stress that the memory blocks would have otherwise gotten.

Figure 5:
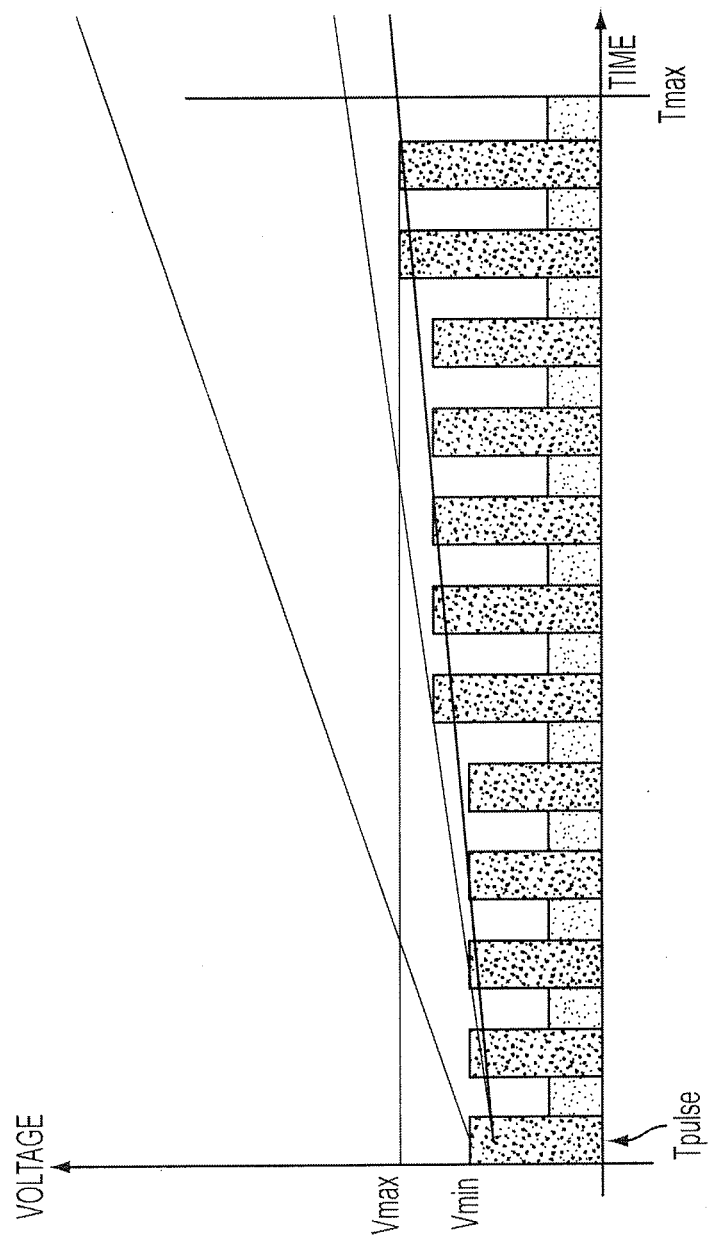
FIG. 5 is a voltage-time graph showing exemplary erase operations for NAND memories when Ntrain is set to be 5.

FIG. 5 is another example when Ntrain is set to be 5. In FIG. 5 is shown an example of the voltage-time graph with Vmin=16V, Vstep=0.5V, Vmax=17V, Verify voltage=2V, Tverify=100 μsec, Ntrain=5, Cmax=12, and Tpulse=300 μsec. In this case, it is possible to further reduce the shape of erase sequence with Tpulse being fixed at minimum. As Tmax cannot be overcome even if the last train of pulses is equal to 2 out of 5 Ntrains. This is because the present invention also considers the maximum number of pulses not to be overcome, and if this number is reached and last verify fails, the erase algorithm ends with a fail. No change in the ROM code is required to switch from an algorithm in FIG. 3 with Ntrain=3 to FIG. 4 with Ntrain=5.

Figure 6:
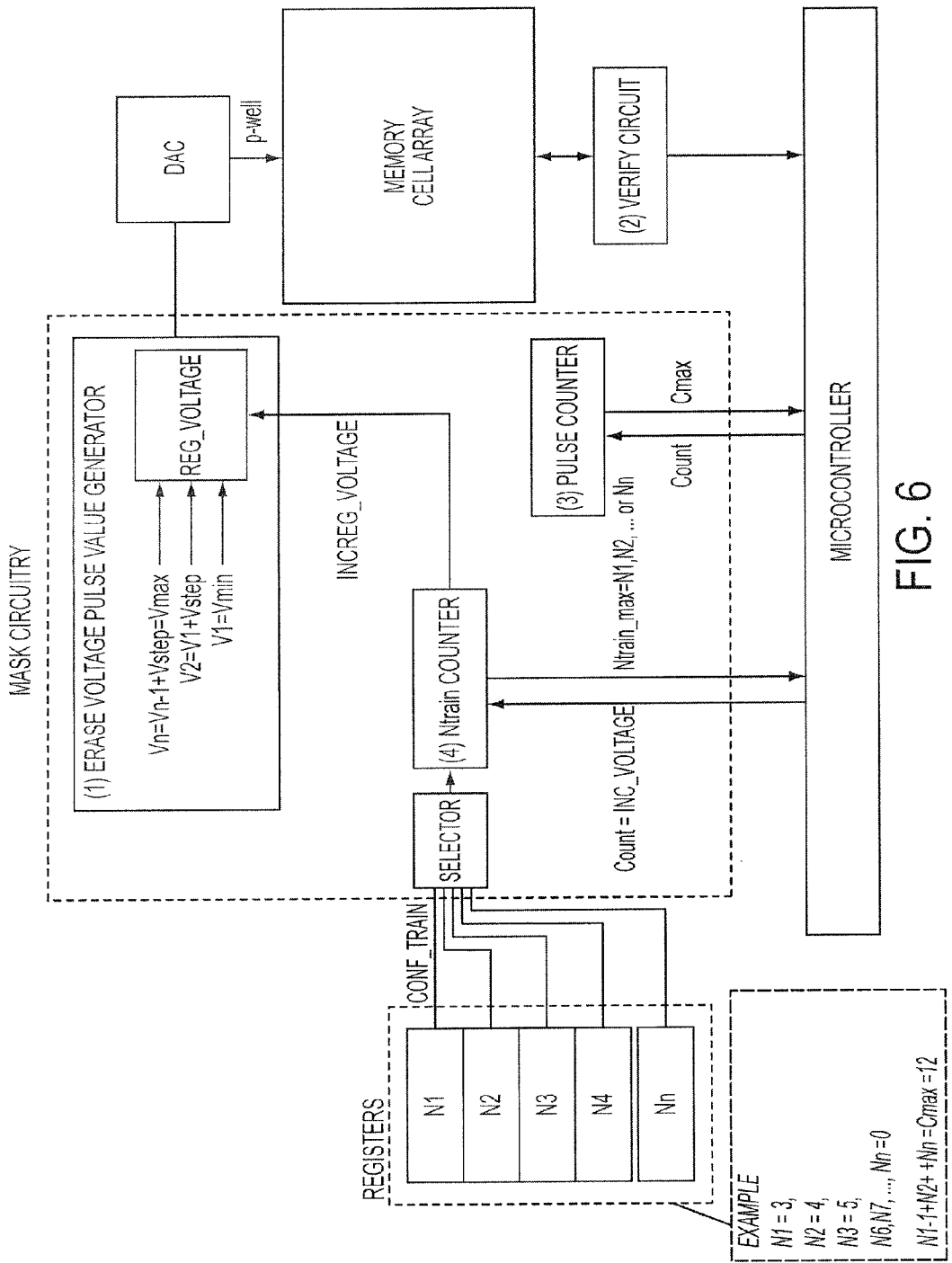
FIG. 6 is another block diagram showing an exemplary non-volatile memory device that can be used to implement the erase algorithm of FIG. 1.
Figure 7:
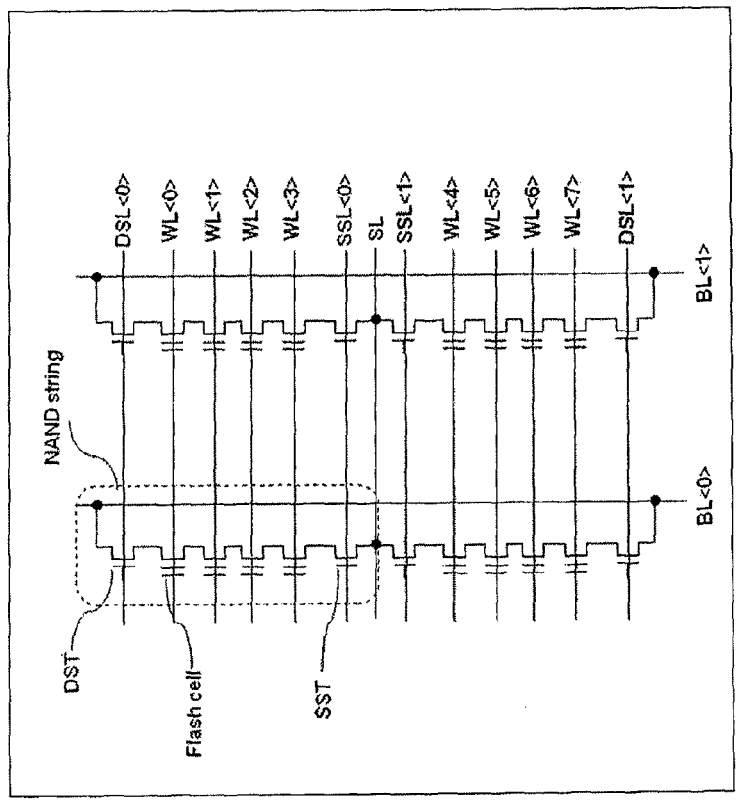
FIG. 7 is a diagram of an exemplary NAND memory array.

In another embodiment, FIG. 6 shows a non-volatile memory device for implementing the algorithm of FIG. 1 with flexibility of numbers of Ntrain. Explanations about the same components to FIG. 3 are omitted.

Different from FIG. 3, the non-volatile memory device comprises a selector. The selector is coupled to registers. The registers are a storage area that corresponds to the CAMS of FIG. 3. Each of the registers stores a single number, and totally numbers (N1, N2 . . . Nn) are stored in the registers.

The microcontroller controls the selector to select sequentially each of the stored numbers (N1, N2 . . . Nn) and set the selected one to the Ntrain counter. Cmax may be structured to be addition of the numbers (Cmax=N1+N2+ . . . +Nn. N1, N2 . . . and Nn).

In this case, the device may need a larger storage area to store the numbers (N1, N2 . . . Nn) than CAMS of FIG. 3, however, the flexibility of Ntrain can be obtained. For example, if it is set such that N1=3, N2=3, N3=3, N4=3, N5, N6 . . . and Nn=0, the erase operation (erase algorithm) of FIG. 4 is provided. If it is set such that N1=5, N2=5, N3=2, N4, N5, N6 . . . and Nn=0, the erase operation (erase algorithm) of FIG. 5 is provided. In addition, if it is set such that N1=3, N2=4, N3=5, N4, N5, N6 . . . and Nn=0, still another erase operation (not shown) can be provided.

If the device comprises multiple sets of registers (storage area) that stores all of the above-exemplified numbers, all of FIG. 4, FIG. 5 and the still anther operation can be provided. Those erase operations may be structured to be selected by the microcontroller, and this may be performed in associated with total cycling number of program or erase operations that the cells have experienced.

Exemplary embodiments of various techniques, circuits, and devices have been described. One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method comprising:
applying a first voltage to a memory cell;
applying again the first voltage to the memory cell when the memory cell have not been shifted to an erased condition;
applying a second voltage to the memory cell when the memory cell have not still been shifted to an erased condition, the second voltage being higher than the first voltage;
applying a third voltage to the memory cell when the memory cell is not in the erased condition after applying the second voltage, the third voltage being higher than the second voltage;
applying the second voltage at least one more time prior to applying the third voltage;
wherein the first voltage is applied a first number of times and the second voltage is applied a second number of times, each of the first number and the second number is plural and the first number is equal to the second number; and
wherein the first number is set according to the following equation:

$$Ntrain = (Tmax \times Vstep) / \{(Vmax - Vmin) \times Tpulse\}$$

wherein Ntrain is the first number, Vmax is a maximum voltage permitted to be used in an erase operation, Vmin is a minimum voltage to be used in the erase operation, Tmax is a maximum time allowed for the total erase operation, Vstep is an amount of voltage difference between the first voltage and the second voltage, and Tpulse is the time duration of the erase operation.

2. The method of claim 1 comprising:
identifying a gap between a minimum voltage and a maximum voltage, the minimum voltage being used in an erase operation to have an erase effect on a memory cell block, the maximum voltage being used in an erase operation to prevent an undesired effect, and
applying the method of claim 1 when the gap is less than a defined amount.

3. The method of claim 1, further comprising:
applying the first voltage to the memory cell at least one more time prior to applying the second voltage.

4. The method of claim 1, further comprising:
applying the second voltage to the memory cell at least one more time when the memory cell is not in the erased condition.

5. The method of claim 1, further comprising:
applying the third voltage to the memory cell at least one more time when the memory cell is not in the erased condition.

6. The method of claim 1, wherein the memory cell is structured in a NAND type.

7. The method of claim 1, wherein each of the first and second voltages is supplied to a well of the memory cell.

8. A method comprising:
applying a first voltage to a memory cell;
applying again the first voltage to the memory cell when the memory cell have not been shifted to an erased condition;
applying a second voltage to the memory cell when the memory cell have not still been shifted to an erased condition, the second voltage being higher than the first voltage;
applying a third voltage to the memory cell when the memory cell is not in the erased condition after applying the second voltage, the third voltage being higher than the second voltage;
applying the second voltage at least one more time prior to applying the third voltage;
wherein the first voltage is applied a first number of times and the second voltage is applied a second number of times, each of the first number and the second number is plural and the first number is equal to the second number; and
wherein memory characteristics conform to the following condition $$(Tmax \times Vstep) / (Vmax - Vmin) > Terase\_min$$

Tmax being a maximum time allowed for total erase operations, Vstep being an amount of voltage difference between the first voltage and the second voltage, Vmax being a maximum voltage permitted to be used in an erase operation, Vmin being a minimum voltage to be used in the erase operation, and Terase_min being a minimum time necessary to successfully erase the memory cell.

9. The method of claim 8, further comprising:
applying the first voltage to the memory cell at least one more time prior to applying the second voltage.

10. The method of claim 8, further comprising:
applying the second voltage to the memory cell at least one more time when the memory cell is not in the erased condition.

11. The method of claim 8, further comprising:
applying the third voltage to the memory cell at least one more time when the memory cell is not in the erased condition.

12. The method of claim 8, wherein the memory cell is structured in a NAND type.

13. The method of claim 8, wherein each of the first and second voltages is supplied to a well of the memory cell.

14. A method comprising:
inputting data into a memory device so that the memory device performs a memory erase operation on a memory cell included therein;
the inputting comprising:
defining a maximum voltage permitted to be used in the erase operation, the maximum voltage being Vmax;
defining a minimum voltage permitted to be used in the erase operation, the minimum voltage being Vmin;
defining an amount of an erase voltage step used in the erase operation, the amount being Vstep;
defining a maximum time permitted to be used in the erase operation, the maximum time being Tmax; and
varying a first number of pulses used in the erase operation that are a same voltage as each other and a timing duration of each pulse, according to the following equation:

$$Ntrain = (Tmax \times Vstep) / \{(Vmax - Vmin) \times Tpulse\}$$

wherein the first number is Ntrain and the timing duration is Tpulse.

15. The method of claim 14, wherein memory characteristics conform to the following condition $$(Tmax \times Vstep)/(Vmax - Vmin) > Terase\_min,$$

wherein Terase_min is a minimum time necessary to successfully erase the memory cell.

16. The method of claim 14, wherein the inputting comprising:
deciding the first number and the timing duration of each pulse.

17. The method of claim 16, further comprising:
performing, in response to an erase command, the erase operation on the memory cell of the memory device based on the first number and the timing duration of each pulse that have been decided.

18. The method of claim 14, wherein the memory cell is structured in a NAND type.

\* \* \* \* \*